United States Patent
Webb et al.

(10) Patent No.: US 9,659,677 B2
(45) Date of Patent: May 23, 2017

(54) SHIELDING DEVICE FOR SUBSTRATE EDGE PROTECTION AND METHOD OF USING SAME

(71) Applicant: Varian Semiconductor Equipment Associates, Inc., Gloucester, MA (US)

(72) Inventors: Aaron P. Webb, Austin, TX (US); Charles T. Carlson, Cedar Park, TX (US); William T. Weaver, Austin, TX (US); Timothy J. Miller, Ipswich, MA (US); James D. Strassner, Austin, TX (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 133 days.

(21) Appl. No.: 14/317,167

(22) Filed: Jun. 27, 2014

(65) Prior Publication Data
US 2015/0380116 A1    Dec. 31, 2015

(51) Int. Cl.
| | |
|---|---|
| *G21F 3/00* | (2006.01) |
| *H01L 21/265* | (2006.01) |
| *H01L 31/18* | (2006.01) |
| *H01L 21/687* | (2006.01) |

(52) U.S. Cl.
CPC .............. *G21F 3/00* (2013.01); *H01L 21/265* (2013.01); *H01L 21/68707* (2013.01); *H01L 21/68728* (2013.01); *H01L 31/18* (2013.01)

(58) Field of Classification Search
None
See application file for complete search history.

(56) References Cited

U.S. PATENT DOCUMENTS

| | | | |
|---|---|---|---|
| 2006/0024451 A1* | 2/2006 | Mungkekar | ........... H01J 37/321 427/569 |
| 2014/0283743 A1* | 9/2014 | Yasumatsu | .......... C23C 14/3407 118/504 |

* cited by examiner

*Primary Examiner* — Dah-Wei D Yuan
*Assistant Examiner* — Jethro M Pence

(57) ABSTRACT

A shielding device for shielding an edge of a semiconductor substrate can include a multisided frame defining a perimeter of an enclosed area, and a shield coupled to the frame. The shield may be configured to move between a first position where the shield is retracted to the perimeter and a second position where shield advanced into the enclosed area. A method for processing a semiconductor substrate includes placing a semiconductor substrate in position in an implantation chamber, covering edges of the semiconductor substrate by pushing shields into engagement with the edges, performing an ion implantation procedure, and retracting the shields from the edges.

15 Claims, 6 Drawing Sheets

SHIELDING DEVICE FOR SUBSTRATE EDGE PROTECTION AND METHOD OF USING SAME

BACKGROUND

Field

Embodiments relate to substrate processing in general, and in particular to a device for protecting semiconductor substrate edges during processing.

Discussion of Related Art

Ion implantation of solar cells produces higher-efficiency cells when compared with traditional diffusion furnaces and has the added benefit of only implanting on one side of a semiconductor substrate. The use of diffusion furnaces typically requires an additional step of laser junction Isolation around the perimeter of the as-doped substrates to create electrical separation between the front and back surfaces of the substrate. Failure to do so can lead to current reversal or "IREV" problems which can lead to failure, overheating, and/or discoloration of solar cells. Because ion implantation only results in implanted material on one side of the substrate, an additional step of laser junction isolation can be dispensed with. However, care should be taken to prevent implanted material from being implanted on the edges (or back) of the substrate.

SUMMARY

In view of the above, it would be desirable to provide device that is capable of shielding edges of a semiconductor substrate during an ion implantation procedure. It would also be desirable to provide a method for ion implantation of a semiconductor substrate, wherein edges of the semiconductor substrate are shielded from ions during implantation.

This Summary is provided to introduce a selection of concepts in a simplified form that are further described below in the Description of Embodiments. This Summary is not intended to identify key features or essential features of the claimed subject matter, nor is it intended as an aid in determining the scope of the claimed subject matter.

A shielding device for shielding an edge of a semiconductor substrate is disclosed. The shielding device can include: (a) a multisided frame defining a perimeter of an enclosed area, and (b) a shield coupled to the frame, the shield being configured to move between a first position where the shield is retracted to the perimeter and a second position where shield advanced into the enclosed area.

A method for processing a semiconductor substrate is also disclosed. The method may comprise: placing a semiconductor substrate in position in an implantation chamber, covering edges of the semiconductor substrate by pushing shields into engagement with the edges, performing an ion implantation procedure, and retracting the shields from the edges.

A shielding device for shielding an edge of a semiconductor substrate is further disclosed. The shielding device may comprise: (a) a multisided frame defining a perimeter of an enclosed area, (b) a plurality of shields coupled to the frame, the shields configured to move between a first position where the shields are retracted to the perimeter and a second position where the shields are advanced into the enclosed area, (c) a plurality of scissor-type mechanisms, and (d) a plurality of springs, wherein the shields are coupled to the scissor-type mechanisms, wherein the shields are biased to the second position by the plurality of springs and wherein the shields are forced to the first position by advancing pins into the scissor mechanisms. Such a device may be suitable for use in a system that comprises the device and an additional device comprising a plurality of pins and an actuator configured to advance and retract the pins.

BRIEF DESCRIPTION OF THE DRAWINGS

The accompanying drawings illustrate embodiments of the disclosed method so far devised for the practical application of the principles thereof, and in which.

DESCRIPTION OF EMBODIMENTS

Embodiments of various devices and methods for shielding one or more edges of a substrate will now be described. A non-exemplary list of such substrates includes semiconductor substrates (also referred to as "wafers") and solar cell substrates.

Figure 1:
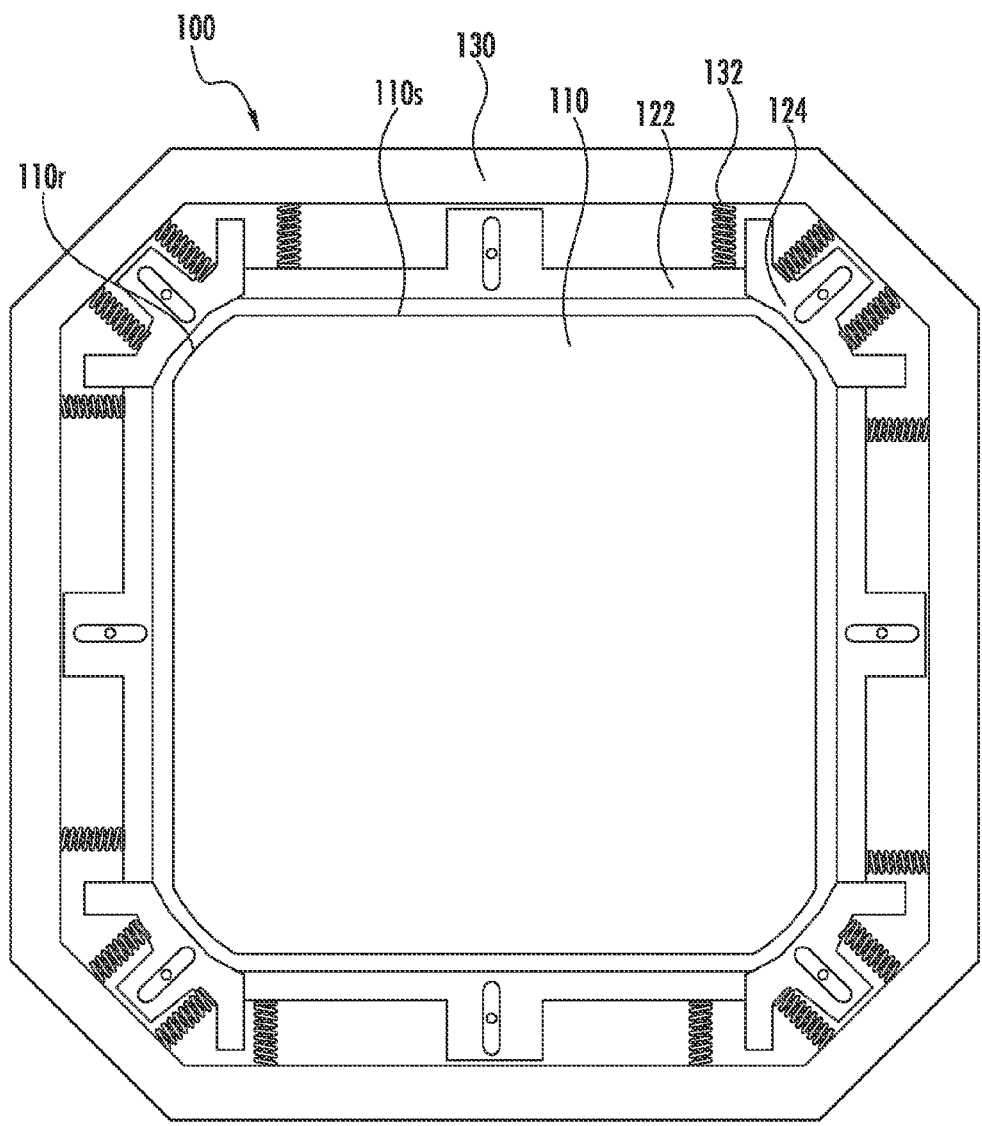
FIG. 1 is a schematic illustration of a device for shielding an edge of a substrate in accordance with an embodiment of the present disclosure.

Turning now to the drawings, FIG. 1 is a schematic illustration of a shielding device 100 for shielding edges of a semiconductor substrate 110. In the illustrated embodiment the substrate 110 substrate 110 may be, for example, an "obround" substrate, which is cut from a round stock. These substrates can have four straight side edges 110s (one numbered) and four rounded corner edges 110r (one numbered), totaling eight edges, although there will differing numbers of edges for different cell geometries. It will be appreciated that the specific geometry of the semiconductor substrate 110 is not critical, and that the disclosed shielding device 100 can be adapted for use with substrates having other shapes.

In exemplary solar cell applications, the straight edges 110s may range, for example, from 115 to 160 mm (e.g., ranging from 115 to 120 to 125 to 130 to 135 to 140 to 145 to 150 to 155 to 160 mm) in length, among other values, the length of the arc of the rounded corner edges 110r may range, for example, from 0 to 30 mm (e.g., ranging from 5 to 10 to 15 to 20 to 25 to 30 mm) in length, among other values, and the substrate thickness may range, for example, from 110 to 170 μm, among other values. It will be appreciated that these ranges are provided as examples only, and that the disclosure is not limited to such ranges.

The shielding device 100 may include a multisided frame 130 (e.g., a metal spine) defining a perimeter of an enclosed area, as well as a plurality of shields which can include four side shields 122 (one numbered) and four corner shields 124 (one numbered) coupled to the frame 130.

In solar cell applications, the side shields 122 and corner shields 124 may have edges that substantially match the length of the substrate edges, for example, corresponding to the ranges set forth above for the straight edges 110s in the case of the side shields 122, and corresponding to the ranges set forth above for the rounded corner edges 110r in the case of the corner shields 124.

The side shields 122 and corner shields 124 may be configured to move between a first position where the side shields and corner shields are retracted to the perimeter and a second position where the side shields and corner shields are advanced into the enclosed area and into engagement with the straight side edges 110s and the rounded corner edges 110r of the substrate 110 substrate 110. The side shields 122 and the corner shields 124 may be made of any of a variety of appropriate materials, including graphite, silicon carbide, silicon oxide (e.g., quartz), silicon nitride, steel, aluminum, aluminum oxide (e.g., alumina) and polyether ether ketone (PEEK), among others.

Springs 132 (one numbered) may be positioned between the multisided frame 130 and the side shields 122 and the corner shields 124 to bias the side shields and corner shields toward the center of the enclosed area so that the side shields and corner shields engage the straight side edges and rounded corner edges 110s, 110r, thereby blocking the straight side edges and rounded corner edges to prevent ions from impinging on the edges during ion implant operations. An actuator (not shown) can be provided to retract the side shields 122 and the corner shields 124 away from the straight side edges and rounded corner edges 110s, 110r to enable the substrate 110 to be engaged with, or removed from, the shielding device 100. The side shields and corner shields 122, 124 may also be pivotable to adjust for minor misalignment (e.g., translation or rotation) of the substrate 110. For example, in the embodiment shown in FIG. 1, each of the side shields and corner shields 122, 124 is biased using a pair of springs 132 which are spaced apart along a length of each of the side shields and corner shields. This dual-spring arrangement may allow the side shields and corner shields 122, 124 to pivot so that, in the event the substrate 110 is rotated slightly relative to the frame 130, the side shields and corner shields 122, 124 can accommodate that misalignment and can fully engage the straight side edges and rounded corner edges 110s, 110r of the rotated substrate.

In the illustrated embodiment, the side shields and corner shields 122, 124 are configured to directly engage the substrate 110. It will be appreciated, however, that the side shields and corner shields 122, 124 need not touch the edges of the substrate 110 in order to protect the straight side edges and rounded corner edges 110s, 110r from implantation, and instead may simply overshadow the side edges and corner edges.

Figure 2A:
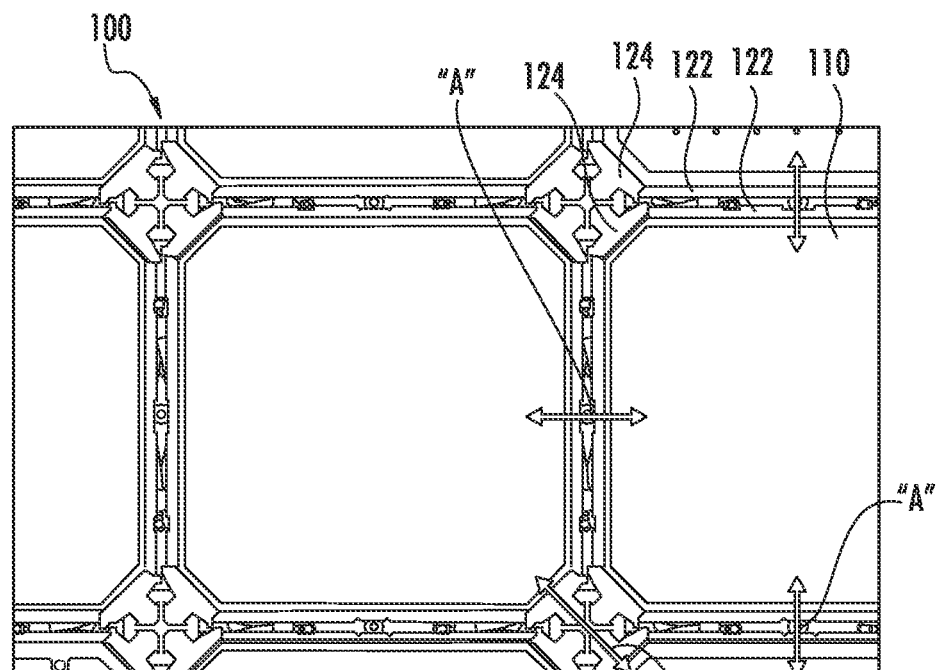
FIGS. 2A-2B are partial schematic illustrations of a device for shielding an edge of a substrate in accordance with another embodiment of the disclosure wherein shields are shown in the refracted and extended positions, respectively.
Figure 2B:
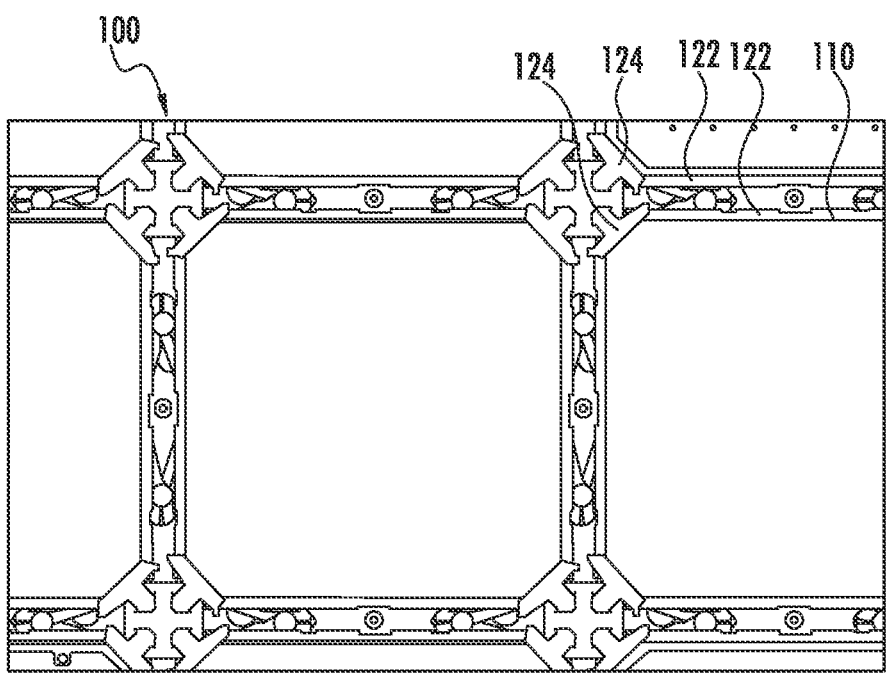

FIGS. 2A-2B show a portion of shielding device 100 for shielding the straight side edges and rounded corner edges 110s, 110r (FIG. 1) of a plurality of semiconductor substrates 110 (one numbered). For example, the shielding device 100 may be constructed to shield an array of substrates 110 of any size (e.g., 4×4 array totaling 16 cells, among many other possibilities).

The substrates 110 shown are "obround" substrates like that described above, although as previously noted other substrate geometries can be accommodated. The shielding device 100 may include a multisided frame defining perimeters for a plurality of enclosed areas. The shielding device 100 also may include a plurality of shields coupled to the frame for deployment into each enclosed area. In one non-limiting exemplary embodiment, four side shields 122 (two numbered) and four corner shields 124 (two numbered) can be provided for each enclosed area. As can be seen by comparing FIG. 2A with FIG. 2B, the side shields and corner shields 122, 124 can be configured to move between a first position in which the side shields and corner shields 122, 124 are retracted to a perimeter of the multisided frame (see FIG. 2A) and a second position where the side shields and corner shields 122, 124 are advanced into the enclosed area and into engagement with the straight side edges and rounded corner edges 110s, 110r (FIG. 1) of the substrate 110 (see FIG. 2B). In this regard, each side shield 122 is configured to move in tandem laterally (i.e., in the direction of arrow "A") between the first and second positions, and each corner shield 124 is configured to move in tandem diagonally (i.e., in the direction of arrow "B") between the first and second positions.

Figure 3A:
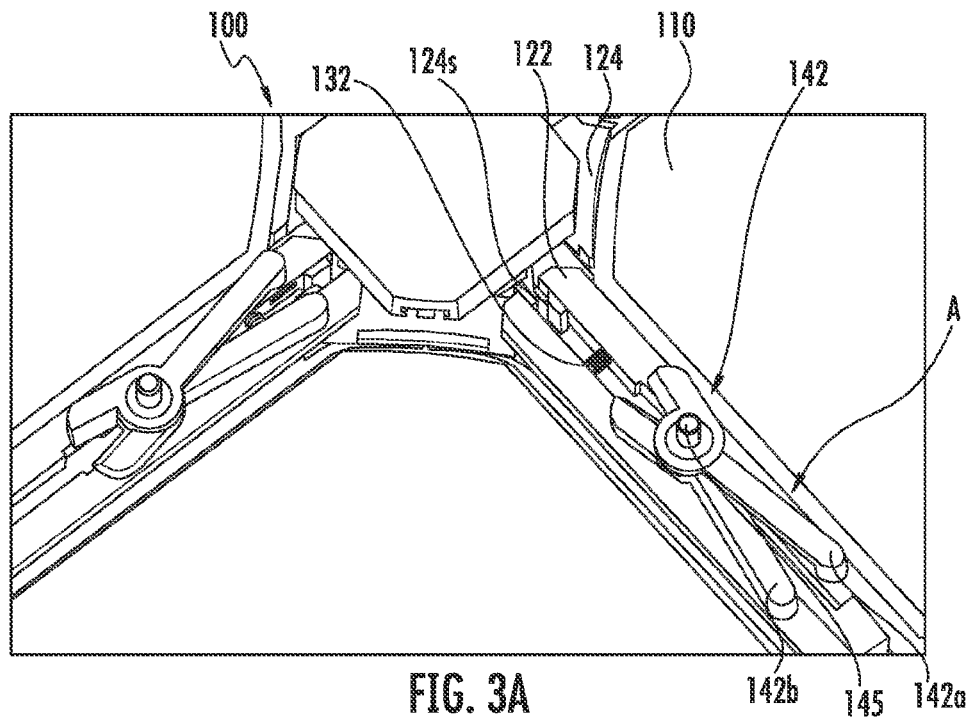
FIGS. 3A-3B are partial cutaway schematic illustrations showing the operation of the device of FIGS. 2A-2B using spring and scissoring mechanisms.
Figure 3B:
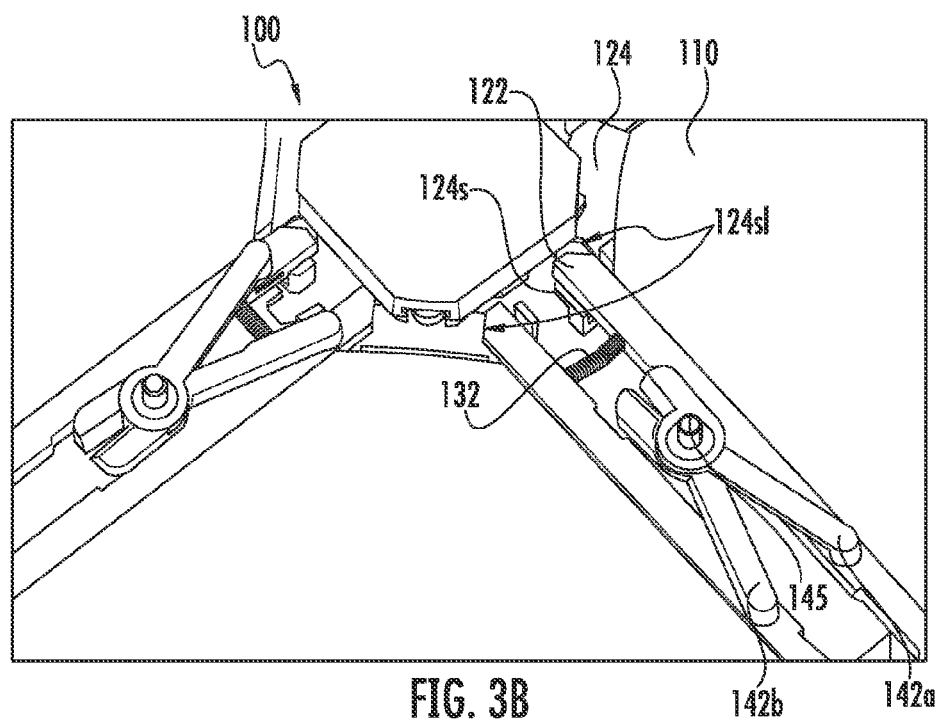

As will be appreciated by those of ordinary skill in the art, various mechanisms can be employed to move the side shields and corner shields 122, 124 between the first and second positions. One non-limiting exemplary mechanism is shown in FIGS. 3A-3B, which illustrate a portion of shielding device 100 for shielding edges of a plurality of semiconductor substrates 110 (three shown, one numbered). While the substrates 110 shown are "obround" substrates, other substrate geometries can also be accommodated. As described above, the shielding device 100 includes a multisided frame defining perimeters of a plurality of enclosed areas. The shielding device 100 can also include a plurality of shields coupled to the frame in each enclosed area, specifically, four side shields 122 (one numbered) and four corner shields 124 (one numbered). As can be seen by comparing FIG. 3A with FIG. 3B, the side shields and corner shields 122, 124 are configured to move between a first position in which the side shields and corner shields 122, 124 are retracted to the perimeter of the shielding device 100 (see FIG. 3A) and a second position where the side shields and corner shields 122, 124 are advanced into the enclosed area and into engagement with the side edges and corner edges of the substrate 110 (see FIG. 3B).

Springs 132 (one numbered) may be used to bias the side shields and corner shields 122, 124 toward the center of the enclosed area and against straight side edges and rounded corner edges 110s, 110r (FIG. 1) of the substrate 110, thereby protecting the edges from impingement by ions during an implanting procedure. In the embodiment shown, spring 132 is disposed between a pair of side shields 122 to simultaneously bias the pair of side shields 122 toward the centers of two adjacent enclosed areas.

The shielding device 100 may also include a plurality of scissor mechanisms 142, each comprising first and second elongated members 142a, 142b that cross one another, and are engaged to each other, at a pivot 145. The first and second elongated members 142a, 142b may be rotatably coupled to the pair of side shields 122 on a first side "A" of the pivot 145 for selectively moving the side shields 122 between the first and second positions. Spring 132 may bias the pair of side shields 122 apart, and in doing so the spring may also bias first and second elongated members 142a, 142b of the scissor mechanism 142 apart on either side of the pivot 145. Thus arranged, the pairs of side shields 122 are normally biased in the second position where the side shields are advanced into engagement with the straight side edges 110s of the substrate 110 (FIG. 3B). To configure the side shields 122 in the second position (shown in FIG. 3A), one or more actuators may be employed to force the first and second elongated members 142a, 142b of the scissor mechanism together on the first side of the pivot 145, to overcome the bias of the spring 132. This places the side shields 122 in the first position where the shields 122 are retracted to the perimeter of the shielding device 100.

Figure 4A:
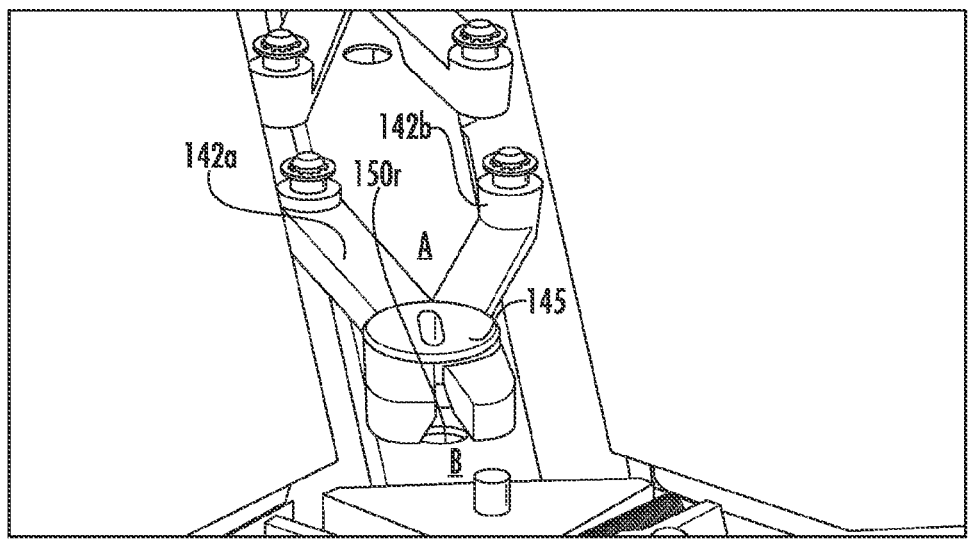
FIGS. 4A-4B are partial schematic illustrations showing the interaction of a retractable pin with the scissoring mechanism of FIGS. 3A-3B.
Figure 4B:
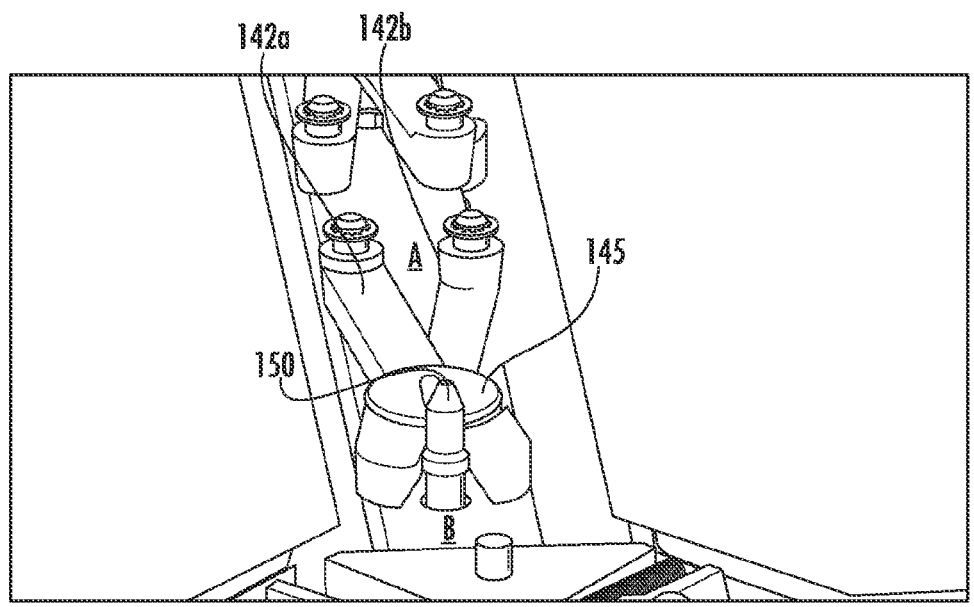

The actuators can be any of a variety of actuating mechanisms. In one non-limiting exemplary embodiment the actuators are movable pins. FIGS. 4A-4B show one possible way in which such movable pins can be used as actuators. In the views of FIGS. 4A-4B, the side shields 122 are not shown, for clarity, but it will be appreciated that a pair of side shields are coupled to the first and second elongated members 142*a*, 142*b* on a first side "A" of the pivot in FIGS. 4A-4B for movement between the first and second positions. As a result, when the side shields 122 move toward the first position, the first and second elongate members 142*a*, 142*b* on the first side "A" of the pivot 145 move toward one another, and the first and second elongate members on a second side "B" of the pivot—opposite the first side of the pivot—move away from one another. Conversely, when the side shields 122 move toward the second position, the first and second elongate members 142*a*, 142*b* on the first side "A" of the pivot 145 move away from one another, while the first and second elongate members on the second side "B" of the pivot move toward one another.

In the embodiment illustrated, springs (not shown) bias first and second elongated members 142*a*, 142*b* of the scissor mechanism 142 apart on the first side A of the pivot as shown in FIG. 4A. In order to draw the first and second elongated members 142*a*, 142*b* of the scissor mechanism together on the first side of the pivot A, an actuator is used to force the first and second elongate members 142*a*, 142*b* apart on a second side "B" of the pivot that is opposite the first side "A" of the pivot.

In certain embodiments, as can be seen in FIGS. 4A-4B, a pin 150 can be extended from a recess 150*r* on the second side "B" of the pivot 145 to pass between the first and second elongate members 142*a*, 142*b* on the second side "B" of the pivot. By passing between the first and second elongate members 142*a*, 142*b* at this point, the pin 150 spreads the first and second elongate members apart, thus causing the first and second elongate members 142*a*, 142*b* on the first side "A" of the pivot to move toward one another. As will be appreciated, by controlling the position of the first and second elongate members 142*a*, 142*b* on the second side "B" of the pivot 145 it is possible to control the lateral positions of the side shields 122, which are connected to the first and second elongate members 142*a*, 142*b* on the first side "A" of the pivot.

By controlling the position of the pin 150, the position of the side shields 122 can be controlled. With the pin 150 retracted the bias of the spring 132 causes the side shields 122 to assume the first position. Extending the pin 150 overcomes the bias of the spring 132 causing the side shields 122 to assume the second position.

In some embodiments the portion of the pin 150 that engages the first and second elongate members 142*a*, 142*b* may include a taper in order to enable the pin to smoothly push the first and second elongate members apart. In other embodiments, the portion of the first and second elongate members 142*a*, 142*b* that engage the pin 150 may include angled surfaces to achieve a similar purpose. In yet other embodiments (illustrated) the pin 150 may be tapered and the first and second elongate members 142*a*, 142*b* may include angled surfaces.

In one exemplary embodiment, the shielding device 100 may include an array of pins 150, each associated with a respective one of a plurality of scissor mechanisms 142 provided with the shielding device. In one embodiment a servo motor or other appropriate actuator can move the array of pins 150 as a group to operate the plurality of scissor mechanisms to cause the side shields 122 to move between the first and second positions.

It may be desirable for the side shields 122 and corner shields 124 to each independently align to the straight side edges and rounded corner edges 110*s*, 110*r* so that if the substrate 110 not placed perfectly square with respect to the shielding device 100 (e.g., rotated or translated relative to an ideal position), the side shields and side shields can still align with the substrate edges. As noted above, this can be achieved by using two springs 132 for each of the side shields 122 and corner shields 124 as shown in FIG. 1. For the embodiments illustrated in FIGS. 2A-2B and FIGS. 3A-3B this can also be achieved by using two springs 132 for each of the side shields 122.

In some embodiments, the corner shields 124 may have features that enable them to be moved between the first and second positions without the need for separate actuators. That is, the corner shields 124 may be linked to adjacent ones of the side shields 122 so that when the side shields are moved to the first position, the corner shields also moved to the first position. Likewise, when the side shields 122 are moved to the second position, the corner shields are also moved to the second position.

Referring to FIGS. 3A-3B, this can be achieved by providing each of the corner shields 124 with a pair of slots 124*sl*, each of which runs beneath a respective one of the adjacent pair of side shields 122 so that the side shields can slide over the slot surfaces when moving between the first and second positions. At an end of each slot 124*sl* is a stop 124*s* (one numbered) that is sized and configured to engage a side surface of the associated side shield 122. Thus arranged, when the side shields 122 are moved to the first position, the side shields 122 engage the stops 124*s*, forcing the corner shields 124 to move to the first position. When the side shields 122 are moved to the second position, a spring (not shown) associated with the corner shield 124 biases the corner shield back into the second position.

In some embodiments the sides of the stops 124*s* are angled to be parallel to the side surfaces of the side shields 122. In other embodiments each corner shield 124 may be biased toward the second position using the force of a single spring (see below). Alternatively, the side shields 122 may be configured to engage the corner shields 124 (e.g., via an additional stop) so that the corner shields are moved between the first and second positions solely through engagement with the side shields.

Figure 5A:
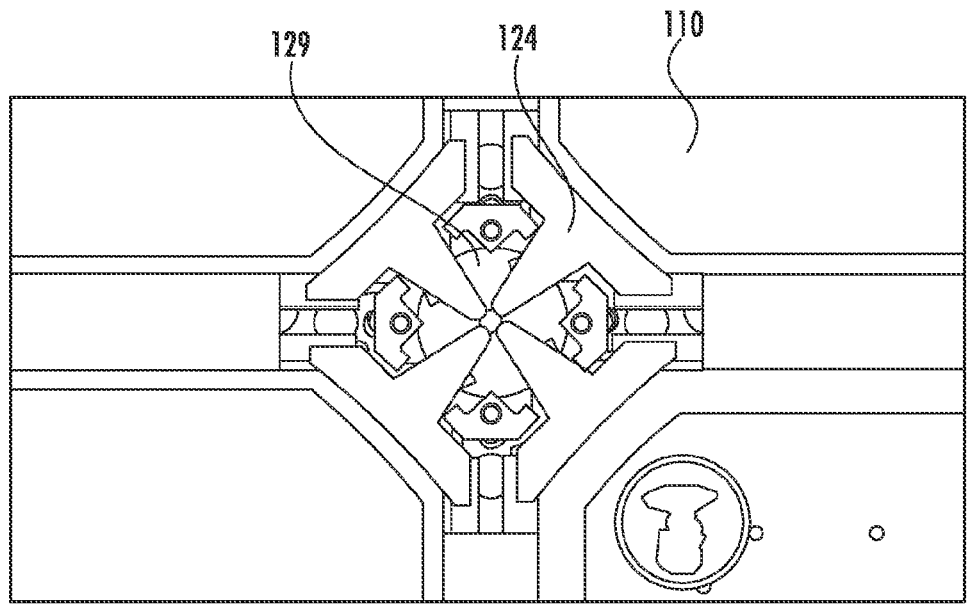
FIGS. 5A-5B are partial schematic illustrations showing the operation of corner shields in the device of FIGS. 2A-2B.
Figure 5B:
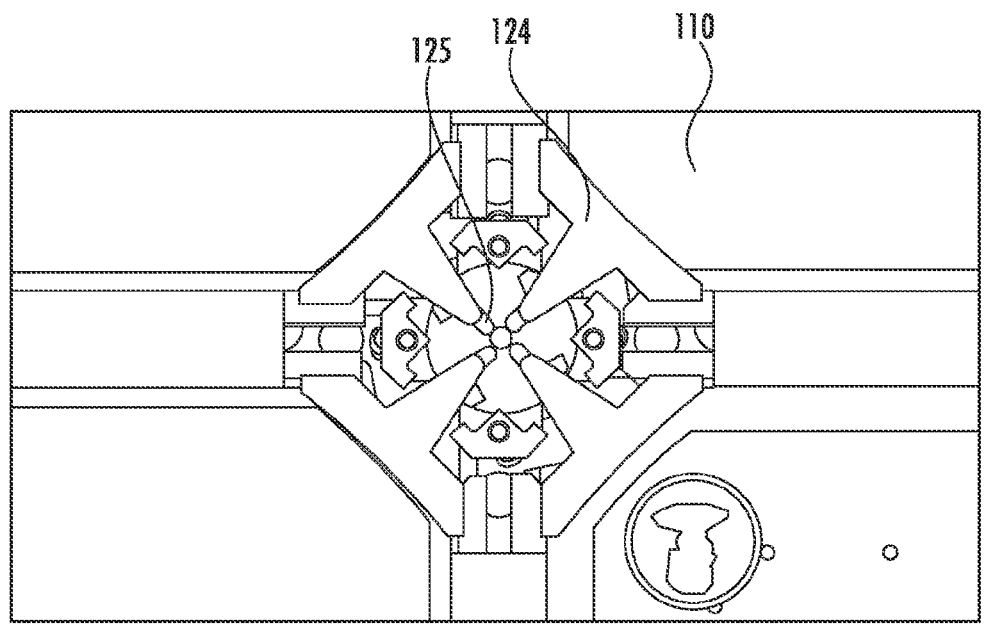

FIGS. 5A and 5B are reverse views of the shielding device 100 showing the bottoms of the corner shields 124. As can be seen, the corner shields 124 may be in the form of an overall "T" shape with an end (opposite the end that contacts the substrate) confined to travel in a diagonal slot 125 formed in a corner portion 129 of the multisided frame 130, for example, by means of a peg (not shown) that travels in the slot 125. By making the slot 125 slightly wider than the peg, a certain amount of pivoting of the corner shield 124 is permitted, improving alignment with an imperfectly positioned substrate, as previously discussed. In certain embodiments, a spring (not shown) may be positioned within each the slot 125 to outwardly bias the corner shields 124 to assume the second position. As previously indicated, because the corner shields 124 are dependent on the motion of the side shields 122, when an actuator is employed to move the side shields 122 to the first position, the corner shields 124, in turn, will be moved to the first position as well.

In various embodiments described herein, a series of parts (e.g., parts made of graphite or selected from another shielding material such as those described above) are placed above the springs and scissor mechanisms, to act as a beam protector and protect the working internal mechanisms from ion beam strikes.

The entire shielding device, which may comprise, for example, a metal spine, numerous shields, numerous springs, numerous scissor mechanisms, various beam protectors, and any requisite fasteners and hardware, may exist as a single removable device.

Figure 6:
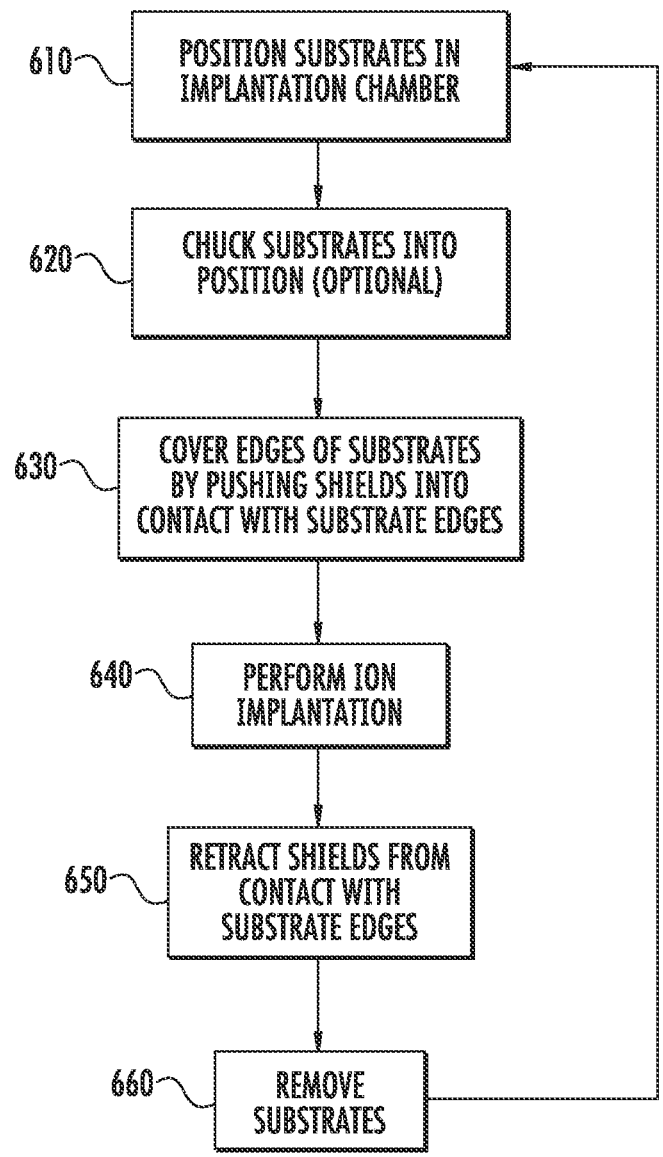
FIG. 6 is a flow diagram illustrating an exemplary method according to the present disclosure.

A specific embodiment of an implantation method that employs a shielding device as described herein will now be described. Prior to preforming the implantation, the shielding device is placed in a process chamber suitable for ion implantation, for example, by coupling the shielding device to an ion beam implant platen. In the implantation method described, as illustrated in FIG. 6, a plurality of semiconductor substrates is positioned in the implantation chamber (block 610), for example, by placing each substrate onto a shielding device like that described herein wherein the shields are in a retracted position. Placement can be performed, for instance, using a robot or other automation equipment. If desired, a chucking fixture (e.g., an electrostatic chuck, etc.) may optionally be activated to lock the substrate in position (block 620).

Edges of the substrate may then be covered by pushing shields (e.g., via a spring mechanism, etc.) into engagement with the edges of the substrates (block 630). For example, a linear motor can retract an array of pins from an array of scissor mechanisms in the shielding device, allowing the shields to advance and align to the edges of the substrates. As described above, the shields may be configured to pivot slightly if required to conform to alignment of the substrate. In certain embodiments, the substrate comprises four straight sides and four corners, and edges at the four straight sides are covered by pushing four (straight) side shields into engagement with the edges at the four sides. In certain of these embodiments, the four corners are four rounded corners, in which case edges at the four rounded corners are covered by pushing four (rounded) corner shields into engagement with the edges at the rounded corners.

After positioning the shields, ion implantation is performed (block 640). Subsequent to ion implantation (and any other desired processing), the shields are retracted from the substrate edges (block 650). For instance, a linear motor can drive an array of pins into an array of scissor mechanisms in the shielding device to operate the scissor mechanisms and retract the shields from contact with the edges of the substrates. After disengagement of the chucking mechanism (if any), the substrates can then be lifted and removed (e.g., using suitable automation equipment). If desired, a new set of substrates can be placed into position and the process repeated.

In some embodiments, the shielding device 100 may be removed from the process chamber. For example, the shielding device 100 may be removed from the process chamber by means of a robot or other automation for service. In certain embodiments, the shielding device 100 may be passed through a silt valve opening into a transfer chamber, which can be vented to atmospheric pressure without requiring a full vent of the larger process chamber. This reduces downtime that might have to be spent in venting and pumping.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. While the disclosure has proceeded with reference to certain embodiments, numerous modifications, alterations and changes to the described embodiments are possible without departing from the spirit and scope of the disclosure, as defined in the appended claims. Accordingly, it is intended that the disclosure not be limited to the described embodiments, but that it has the full scope defined by the language of the following claims, and equivalents thereof.

What is claimed is:

1. A shielding device for shielding an edge of a semiconductor substrate, comprising:
    a multisided frame defining a perimeter of an enclosed area,
    a shield coupled to the frame, said shield configured to move between a first position where the shield is retracted to the perimeter and a second position where the shield advanced into the enclosed area, and
    at least one spring biasing the shield toward the second position.

2. The shielding device of claim 1, wherein the perimeter comprises four sides and four corners, and wherein the shielding device comprises a side shield at each of the four sides, each side shield configured to move in tandem laterally between the first and second positions.

3. The shielding device of claim 2, wherein the shielding device comprises a corner shield at each of the four corners, each corner shield configured to move in tandem diagonally between the first and second positions.

4. The shielding device of claim 3, wherein each corner shield is coupled to at least one side shield.

5. The shielding device of claim 1, comprising at least one actuator that retracts the shield to the first position.

6. The shielding device of claim 1, comprising a scissor mechanism comprising pivotally attached first and second elongated members that cross one another at a pivot, wherein said shield is coupled to the scissor mechanism on a first side of said pivot for movement between the first and second positions such that:
    when the shield moves toward the first position, the first and second elongate members on the first side of the pivot move toward one another, and the first and second elongate members on a second side of the pivot opposite the first side of the pivot move away from one another,
    when the shield moves toward the second position, the first and second elongate members on the first side of the pivot move away from one another, the first and second elongate members on the second side of the pivot move toward from one another.

7. The shielding device of claim 6, comprising an actuator for forcing the shield toward the first position.

8. The shielding device of claim 7, wherein the actuator is configured to force the first and second elongate members on the second side of the pivot apart by advancing a pin between the first and second elongate members on the second side of the pivot.

9. The shielding device of claim 8, wherein the pin is provided with a taper, and wherein the first and second elongate members are provided with angled surfaces on the second side of the pivot.

10. The shielding device of claim 6, comprising a plurality of said scissor mechanisms.

11. The shielding device of claim 10, wherein the plurality of scissor mechanisms are actuated by a plurality of pins.

12. The shielding device of claim 1, wherein the multisided frame defines a plurality of perimeters, a plurality of enclosed areas, and a plurality of shields coupled to the frame, said plurality of shields configured to move between a first position in which the plurality of shields are retracted to associated ones of said plurality of perimeters and a second position in which the plurality of shields are associated ones of said plurality of enclosed areas.

13. The shielding device of claim 12, wherein the shielding device comprises a plurality of scissor mechanisms coupled to the frame between associated ones of said plurality of enclosed areas, and wherein operation of the plurality of scissor mechanisms causes the plurality of shields to move in tandem between the first position and the second position.

14. A shielding device for shielding an edge of a semiconductor substrate comprising:

a multisided frame defining a perimeter of an enclosed area, a plurality of shields coupled to the frame, said shields configured to move between a first position where the shields are retracted to the perimeter and a second position where the shields are advanced into the enclosed area, a plurality of scissor-type mechanisms, and a plurality of springs, wherein the shields are coupled to the scissor mechanisms, wherein the shields are biased to the second position by the plurality of springs and wherein the shields are forced to the first position by advancing pins into the scissor mechanisms.

15. A system comprising the shielding device of claim 14 and an additional device comprising a plurality of pins and an actuator configured to advance and retract the pins.

* * * * *